United States Patent [19]

Masaki

[11] Patent Number: 4,927,491

[45] Date of Patent: May 22, 1990

[54] METHOD OF BONDING IC UNIT

[75] Inventor: Hisashi Masaki, Tokyo, Japan

[73] Assignee: Casio Computer Co., Ltd., Tokyo, Japan

[21] Appl. No.: 347,391

[22] Filed: May 4, 1989

[30] Foreign Application Priority Data

May 16, 1988 [JP] Japan .................................. 63-117004

[51] Int. Cl.$^5$ .......................... B44C 1/22; C23F 1/02; C03C 15/00; C03C 25/06
[52] U.S. Cl. ....................................... 156/630; 29/827; 156/634; 156/644; 156/645; 156/656; 156/659.1; 156/902; 357/70; 361/421; 437/206; 437/220
[58] Field of Search ............... 437/206, 209, 217, 220; 361/400, 401, 404, 405, 421; 357/69, 70; 174/68.5; 29/827; 156/629, 630, 634, 644, 645, 652, 656, 659.1, 661.1, 901, 902

[56] References Cited

U.S. PATENT DOCUMENTS

| | | | |
|---|---|---|---|
| 3,480,836 | 11/1969 | Aronstein | 156/630 X |
| 3,823,467 | 7/1974 | Shamash et al. | 437/209 |
| 4,141,075 | 2/1979 | Taylor | 364/712 |

Primary Examiner—William A. Powell
Attorney, Agent, or Firm—Frishauf, Holtz, Goodman & Woodward

[57] ABSTRACT

A large number of IC device holes are formed in a carrier tape, and a metal foil is formed on one surface of the tape. The metal foil is etched to form finger leads each having an end projecting into a corresponding IC device hole. Connection leads for connecting finger leads connected to different IC devices are formed on the other surface of the carrier tape. An IC device is located in each IC device hole and bonded to the finger leads. The carrier tape is cut so as to form an IC unit having a plurality of IC devices. Upon this cutting, a conductive lead for plating for connecting the finger leads with each other is cut. The IC unit simplifies wiring on the substrate and increases positioning efficiency with respect to the connection terminals.

5 Claims, 6 Drawing Sheets

METHOD OF BONDING IC UNIT

BACKGROUND OF THE INVENTION

1. Field of the Invention

The present invention relates to a method of bonding an IC unit having a plurality of IC devices to connection terminals formed on a substrate.

2. Description of the Related Art

A conventional bonding structure, which has an IC (Integrated Circuit) unit formed by TAB (Tape Automated Bonding) method and a LCD (Liquid Crystal Display), is known. The IC unit includes an IC device and a plurality of lead terminals. The LCD, for use in an apparatus such as a television or a large screen, includes electrodes terminals.

Quite a few display driver chips need to be used in a LCD for a television or a large screen. But, each of IC units used to connect a display driver chip to the LCD, contains only one IC device (display driver chip) mounted on a carrier tape. In other words, in this conventional structure, the number of IC units corresponds to that of IC devices to be connected to the LCD. Thus, a number of IC units must be bonded for connecting electrode terminals of the LCD and a printed circuit board, aligning each of lead terminals of the IC unit with a corresponding electrode terminal of the LCD.

In addition, corresponding lead terminals of the display driver chips (IC devices) connected to the LCD must be connected with each other. In this case, since a wiring pattern of mutual connection crosses other lead terminals, patterning of the mutual connection wiring pattern is complicated. Therefore, in a conventional structure, the mutual connection wiring pattern is formed on the printed circuit board.

In the above method of bonding a single IC device (display driver chip) to finger leads of a single film of a carrier tape, however, positioning to the printed circuit board must be performed for each IC unit. Therefore, a connection operation cannot be performed efficiently, and the yield is low due to a positioning or connection failure at a connection portion. In addition, a complicated wiring pattern for an image processing circuit, a control circuit, a memory circuit and the like must be formed on the printed circuit board. Therefore, if the mutual connection pattern of lead terminals of the display driver chips is formed on the wiring substrate (printed circuit board), very complicated wiring patterning must be performed on the substrate as a whole. As a result, the wiring substrate is enlarged in size, and the manufacturing yield is degraded.

SUMMARY OF THE INVENTION

The present invention has been made in consideration of the above situation and has as its object to provide an IC unit connection structure in which a step of positioning an IC unit with respect to a wiring substrate can be efficiently performed and a wiring pattern on the wiring substrate can be simplified.

According to the present invention, there is provided a bonding method of an integrated circuit unit comprising:

device hole forming step of forming a number of IC device holes in a carrier tape;

laminating step of laminating a first metal foil on at least one surface of the carrier tape;

lead forming step of etching the first metal foil to form a plurality of finger leads each having an end projecting into a corresponding IC device hole, and connection leads for connecting some finger leads to some finger leads each projecting at one end thereof into an adjacent IC device hole;

inner lead bonding step of arranging an IC device in each IC device hole, and bonding the ends of the finger leads to electrodes of the IC devices;

cutting step of cutting the carrier tape for forming an IC unit having a single support tape and a plurality of IC devices which are mounted on said single support tape through the finger leads; and outer lead bonding step of arranging the IC units on a substrate, and bonding the finger leads to connection terminals formed on the substrate.

With the above arrangement, positioning between the IC unit and the wiring substrate can be efficiently performed. In addition, a wiring pattern on the printed circuit board can be simplified.

DETAILED DESCRIPTION OF THE PREFERRED EMBODIMENTS

Figure 1:
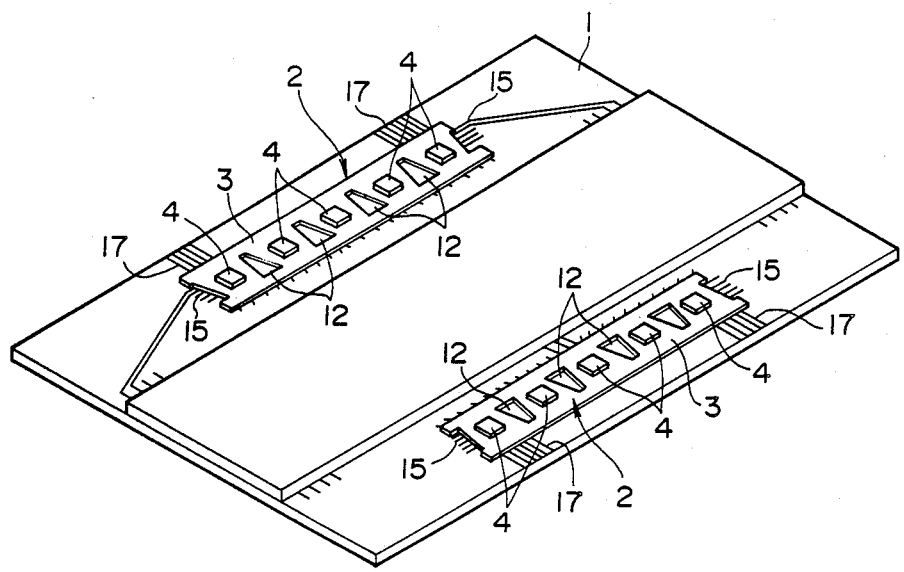
FIG. 1 is a perspective view showing a connection structure of IC units and an LCD according to the present invention.
Figure 2:
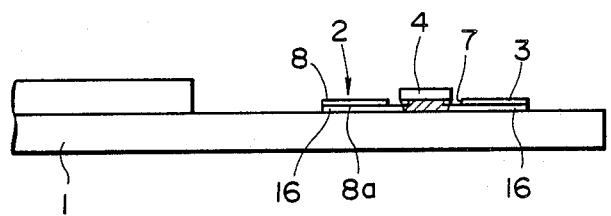
FIG. 2 is an enlarged sectional view showing a main part of FIG. 1.

An embodiment of the present invention will be described below with reference to the accompanying drawings. FIGS. 1 and 2 show TAB (Tape Automated Bonding)-type IC units 2 connected to an LCD substrate 1 of a liquid crystal television or liquid crystal large screen by a connection structure of the present invention.

Figure 3:
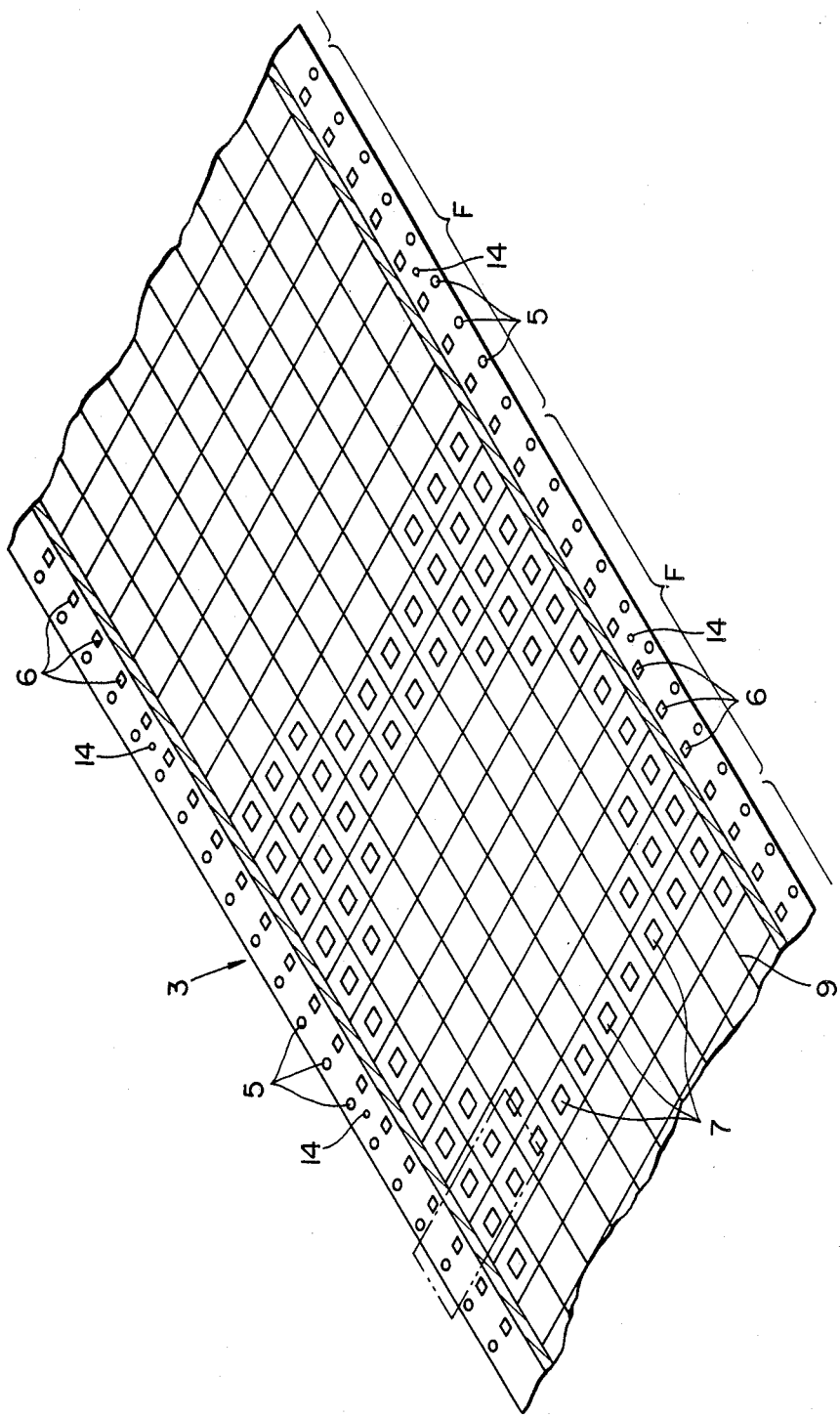
FIG. 3 is a perspective view showing a carrier tape.

In each IC unit 2, five display driver chips (IC devices) 4 are mounted on a tape 3 (cut from a carrier tape 3 shown in FIG. 3). Four of the five display driver chips are for driving segment electrodes (individual electrodes), and the remaining display driver chip is for driving a common electrode.

The IC unit 2 is formed from the carrier tape 3 shown in FIG. 3. The tape 3 having a resin film having flexibility and an insulation property such as a polyester or polyimide resin and has a considerably large width. The tape 3 has two arrays of sprocket holes 5 and 6 in its each side edge portion and a large number of IC device holes 7 in its central portion. The two arrays of sprocket holes 5 and 6 are aligned with each other at predetermined intervals along the longitudinal direction of the tape 3. The sprocket holes 5 are circular. The holes 5 are used to convey the tape 3 to a predetermined processing section in processing steps except for an IC device bonding step. The sprocket holes 6 are square.

Figure 5:
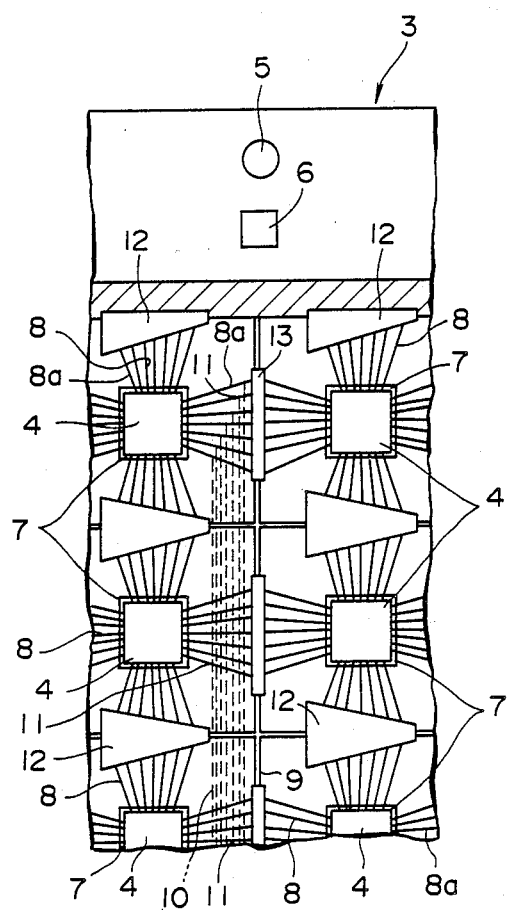
FIG. 5 is an enlarged plan view showing a main part of the carrier tape shown in FIG. 3.

The holes 6 are used to convey the tape 3 to a predetermined processing section in the IC device bonding step requiring high positioning precision. The IC device holes 7 are successively formed along the longitudinal direction of the tape 3 at predetermined intervals such that a plurality of rows (ten rows in FIG. 3) are arranged in the widthwise direction of the tape 3 at predetermined intervals. As shown in FIG. 5 (which is an enlarged view of a portion indicated by an alternate long and two dashed line in FIG. 3), an IC device 4 as a display driver chip for driving a segment or common electrode is mounted in each IC device hole 7. Each IC device 4 is arranged at the lower side of the tape 3, and its electrode (not shown) is bonded to a finger lead 8. The finger lead 8 is formed on the upper surface of the tape 3 to project into a corresponding IC device hole 7. The finger lead 8 is formed by etching a copper foil laminated on the upper surface of the tape 3. When tin or a solder is to be plated on the finger lead 8, the ground potential for plating is applied to each lead 8. For this purpose, in the etching step, matrix copper foil patterns 9 each for surrounding the IC device hole 7 are formed. FIG. 3 shows the carrier tape on which the copper foil patterns 9 are formed. FIG. 5 shows the carrier tape before it is cut to form the IC unit 2. The matrix copper foil patterns 9 are continuously formed as a whole. The finger leads 8 are connected to the patterns 9. Connection patterns 10 are formed on the lower surface of the tape 3 as indicated by broken lines in FIG. 5. The connection patterns 10 connect lead terminals 8a of corresponding finger leads 8 of a plurality of IC device holes 7 with each other. The lead terminal 8a of each finger lead 8 extends to the lower surface side of the tape 3 through a through hole 11 and is connected to the connection pattern 10. Similar to the finger leads 8, the connection pattern 10 is formed by etching a copper foil laminated on the lower surface of the tape 3. After the finger leads 8 are plated, notches (openings) 12 and 13 for interrupting conduction between adjacent finger leads 8 are formed in all sides of the matrix copper foil patterns 9. Since the notches 12 formed in portions of the matrix parallel to the longitudinal direction of the tape 3 are trapezoidal, the lengths of adjacent lead terminals 8a differ from each other. This leads to the result that the adjacent terminals are not to make short-circuited with each other when the finger leads 8 are connected to electrode terminals 15 (to be described later) of the LCD 1. Since the notches 13 formed in portions of the matrix perpendicular to the longitudinal direction of the tape 3 are rectangular, the lengths of the lead terminals 8a of the respective finger leads 8 are equal to each other.

In addition to the sprocket holes 5 and 6, fast setting holes (or marks) 14 for setting a feed amount of the tape are formed for every plurality of (F) columns of the IC device holes 7.

Figure 4:
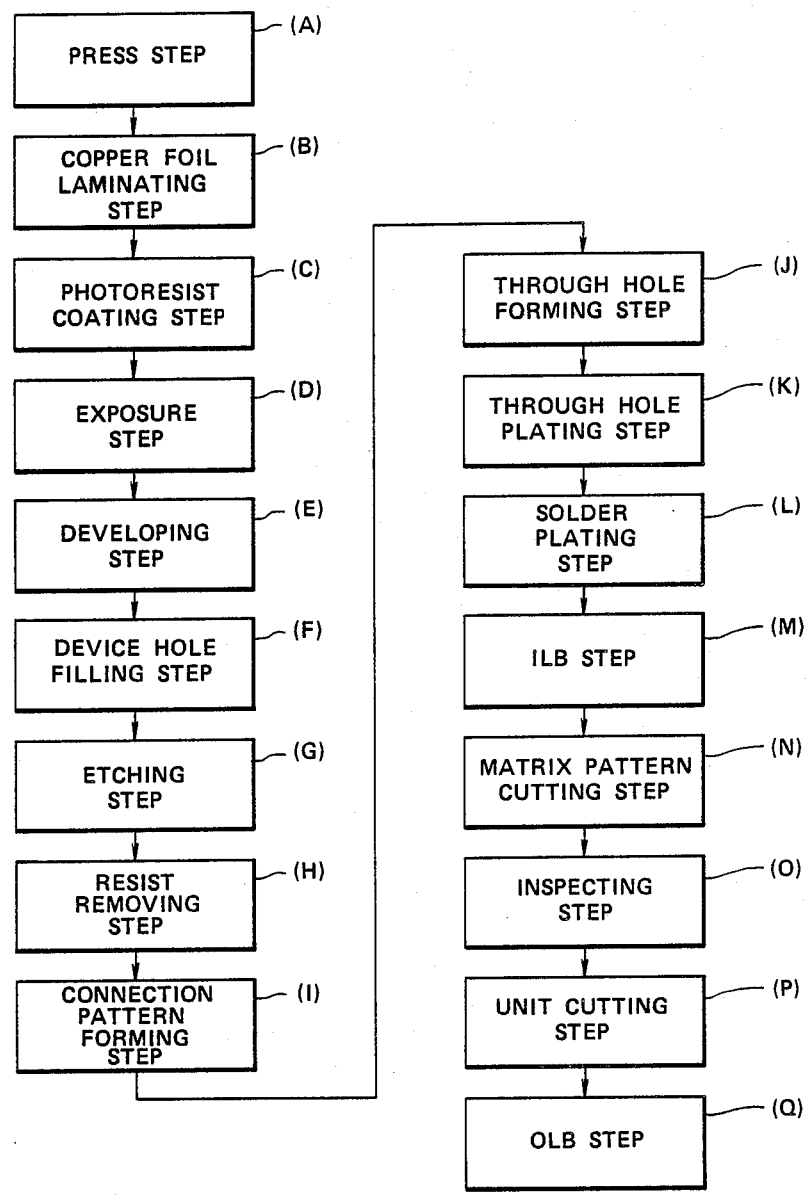
FIG. 4 is a view showing steps for explaining an IC unit manufacturing method according to the present invention.
Figure 6:
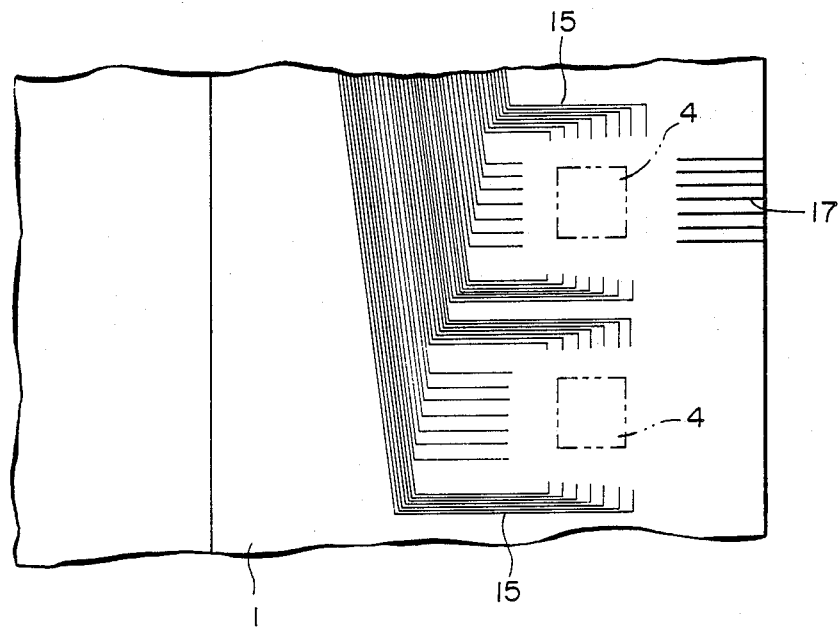
FIG. 6 is an enlarged plan view showing a main part of electrode terminals of the LCD.

The carrier tape 3 having the above arrangement is manufactured by steps (A) to (Q) shown in FIG. 4. That is, in a press step (A), the two arrays of sprocket holes 5 and 6, the IC device holes 7 and the fast setting holes 4 are formed in the tape 3. Although the IC device holes 7 are partially omitted in the drawing (FIG. 3), they are formed in all the matrix copper foil patterns 9. The tape 3 in which predetermined holes are formed in the press step (A) is conveyed to a copper foil laminating step (B), and a copper foil for forming the finger leads 8 and the copper foil patterns 9 is laminated on the upper surface of the tape 3. The tape 3 subjected to the copper foil laminating step (B) is conveyed to a photoresist coating step (C), and a photoresist is coated on the copper foil. The tape 3 subjected to the photoresist coating step (C) is conveyed to an exposure step (D), and light is radiated on the photoresist to expose the finger leads 8 and the copper foil patterns 9. The tape 3 is conveyed to a developing step (E), and predetermined images of the finger leads 8 and the copper foil patterns 9 are developed. The tape 3 subjected to the developing step (E) is conveyed to a device hole filling step (F), and the IC device holes 7 are filled from the lower surface side of the tape 3. This is to correctly etch portions of the finger leads 8 projecting into a corresponding IC device hole 7 in an etching step (G). The tape 3 subjected to the device hole filling step (F) is conveyed to the etching step (G), and etching processing is performed. Upon this etching, the copper foil except for the images (portions for forming the finger leads 8 and the patterns 9) developed in the developing step (E) is removed. The tape 3 subjected to the etching step (G) is conveyed to a resist removing step (H), and the photoresist is removed. FIG. 3 shows the carrier tape 3 after it is subjected to the resist removing step (H). The tape 3 is then conveyed to a connection pattern forming step (I). In this step, a copper foil for forming connection patterns 10 is laminated on the lower surface of the tape 3, a photoresist is coated on the copper foil, and exposure and development are performed to form the connection patterns 10. The tape 3 subjected to the connection pattern forming step (I) is conveyed to a through hole forming step (J), and through holes 11 through which the lead terminals 8a of the finger leads 8 extend to the lower surface and are connected to the connection patterns 10 are formed. The tape 3 subjected to the through hole forming step (J) is conveyed to a through hole plating step (K), and electroless or electrolytic copper plating is performed for the through holes 11. Subsequently, the tape 3 is conveyed to a solder plating step (L), and solder plating is performed for the finger leads 8 by using the copper foil patterns 9. The tape 3 is then conveyed to an ILB (Inner Lead Bonding) step (M), and electrodes (not shown) of the IC devices 4 arranged below the IC device holes 7 are bonded to the finger leads 8, thereby mounting the IC devices 4 on the carrier tape 3. The tape 3 is conveyed to a matrix pattern cutting step (N), and the notches 12 and 13 shown in FIG. 5 are formed in the copper foil patterns 9. The tape 3 is conveyed to an inspecting step (O), and a conduction state of the IC devices 4 bonded to the finger leads 8 is inspected. The tape 3 is conveyed to a unit cutting step (P) and cut so as to form IC units 2 each having IC devices 4 corresponding to a half column, i.e., five IC devices 4. The IC unit 2 cut in the unit cutting step (P) is conveyed to a final OLB (Outer Lead Bonding) step (Q), and the finger leads 8 are connected to the electrode terminals 15 of the LCD substrate 1. The electrode terminals 15 of the substrate 1 are formed as shown in FIG. 6 so that the finger leads 8 of the respective IC devices 4 as display driver chips for driving segment and common electrodes are not short-circuited with each other. The IC unit 2 is bonded to the substrate 1 by using an anisotropically conductive adhesive 16 as shown in FIG. 2.

Of the above processing steps, the copper foil laminating step (B), the developing step (E), the etching step (G) and the like do not require positioning and therefore allow processing of the carrier tape 3 while the tape 3 is conveyed. Therefore, in these steps, a processing speed is unconditionally determined in accordance with the performance of a processing apparatus. In the press step (A), the photoresist coating step (C), the exposure step (D) and the like, however, the carrier tape 3 must be temporarily stopped and positioned in order to execute processing tasks. In this embodiment, in order to increase a processing efficiency of such a step, a plurality of (F) columns are simultaneously processed. More specifically, after predetermined processing is performed for F columns of the IC chips 4, a sprocket rotates to convey the carrier tape 3. When the next fast setting holes 14 are detected by a sensor, rotation of the sprocket is stopped to position the tape 3, and processing is performed for the next F columns. In this embodiment, 10 rows×9 columns=90 IC devices 4 are simultaneously processed upon a single positioning operation.

Since the IC unit 2 connected to the LCD substrate 1 has a number of (five) IC devices 4 as a unit, a printed circuit board (not shown) is connected to the LCD substrate 1 through connection leads 17 at only two positions. Therefore, since the number of connection portions of the printed circuit board is very small, a connection operation can be efficiently performed, and the yield adversely affected by a positioning or connection error at the connection portion can be improved. In addition, since the connection patterns 10 for the IC devices 4 are formed on the IC unit 2, a wiring pattern to be formed on the printed circuit board is not complicated. Therefore, the printed circuit board becomes compact in size, and the manufacturing yield rises.

Figure 7:
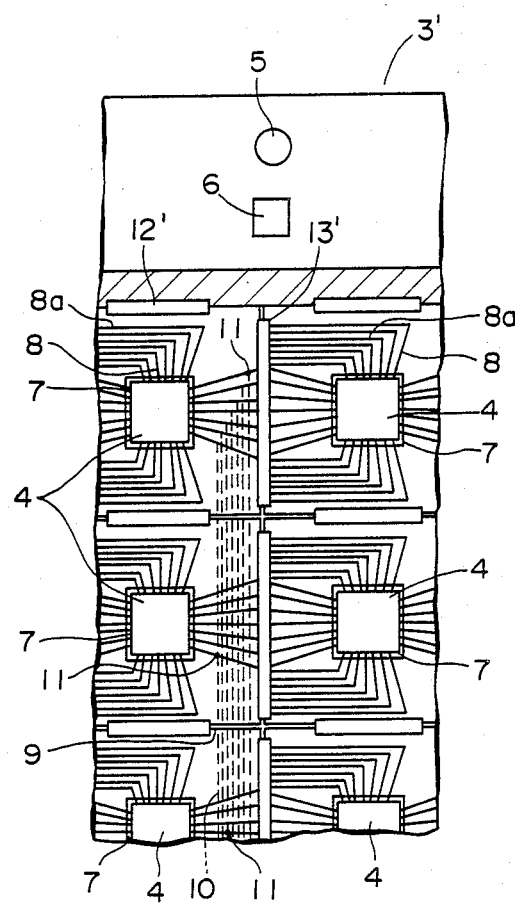
FIG. 7 is a plan view showing a carrier tape for explaining another embodiment of the present invention.
Figure 8:
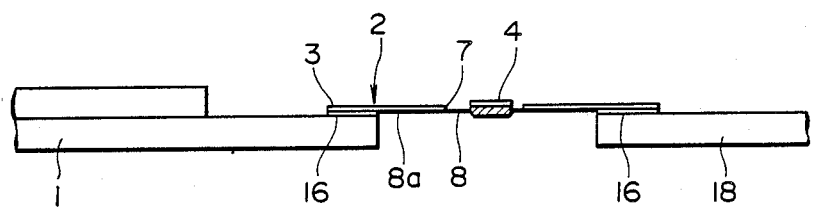
FIG. 8 is a sectional view showing an IC unit connection structure using the carrier tape shown in FIG. 7.

FIG. 7 shows a carrier tape 3' according to another embodiment of the present invention. In this embodiment, notches 12' and 13' are rectangular, and lead terminals 8a of finger leads 8 except for those to be connected to the connection pattern 10 extend toward one side of the tape 3'. When the finger leads 8 are arranged in this manner, an IC unit 2 can be connected to an LCD substrate 1 so that only connection terminals of the tape 3' are mounted on the substrate 1 as shown in FIG. 8. Therefore, the IC unit 2 serves as a connection member for electrically connecting the LCD substrate 1 to a printed circuit board 18. Also in this case, the IC unit 2 is bonded to the LCD substrate 1 and the printed circuit board 18 by using anisotropically conductive adhesives 16. In addition, in the connection structure shown in FIG. 8, the tape 3' can be folded to stack the LCD substrate and the printed circuit board 18.

In the above embodiments, the connection pattern 10 is formed by etching the copper foil laminated on the carrier tape 3. The connection pattern 10, however, may be formed by printing a conductive ink (carbon ink). Also, the IC unit 2 may be bonded to the LCD substrate and the printed circuit board 18 by using not the anisotropically conductive adhesive 16 but a solder.

What is claimed is:

1. A method of bonding an IC unit, comprising:
    a device hole forming step of forming a number of IC device holes in a carrier tape;
    an adding step of adding a first metal foil on at least one surface of said carrier tape;
    a lead forming step of etching said first metal foil to form a plurality of finger leads each having an end projecting into a corresponding IC device hole, and connection leads for connecting some finger leads to some finger leads each projecting at one end thereof into an adjacent IC device hole;
    an inner lead bonding step of arranging an IC device in each IC device hole, and bonding the ends of said finger leads to electrodes of said IC devices;
    a cutting step of cutting said carrier tape for forming an IC unit having a single support tape and a plurality of the IC devices which are mounted on said single support tape through said finger leads; and
    an outer lead bonding step of arranging said IC units on a substrate having connection terminals, and bonding said finger leads to said connection terminals formed on said substrate.

2. A method according to claim 1, wherein said lead forming step comprises:
    forming said finger leads on one surface of said carrier tape;
    forming said connection leads on another surface of said carrier tape; and
    forming through holes in said carrier tape to connect said finger leads to said connection leads.

3. A method according to claim 2, wherein said connection lead forming step comprises:
    adding a second metal foil on said another surface of said carrier tape; and
    etching said second metal foil.

4. A method according to claim 3, wherein said step of adding said second metal foil comprises laminating said second metal foil on said another surface of said carrier tape.

5. A method according to claim 1, wherein said adding step comprises laminating said first metal foil on said at least one surface of said carrier tape.

* * * * *